United States Patent
Klair et al.

(10) Patent No.: US 12,271,670 B2
(45) Date of Patent: Apr. 8, 2025

(54) TESTBENCH FOR SUB-DESIGN VERIFICATION

(71) Applicant: Xilinx, Inc., San Jose, CA (US)

(72) Inventors: Rajvinder S. Klair, San Jose, CA (US); Dhiraj Kumar Prasad, Hyderabad (IN); Saikat Bandyopadhyay, San Jose, CA (US); Ashish Kumar Jain, Hyderabad (IN); Shiyao Ge, San Jose, CA (US); Tapodyuti Mandal, Hyderabad (IN); Miti Joshi, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 508 days.

(21) Appl. No.: 17/650,035

(22) Filed: Feb. 4, 2022

(65) Prior Publication Data

US 2023/0252212 A1    Aug. 10, 2023

(51) Int. Cl.
   *G06F 30/333* (2020.01)
   *G06F 30/327* (2020.01)
   *G06F 30/3308* (2020.01)

(52) U.S. Cl.
   CPC .......... *G06F 30/333* (2020.01); *G06F 30/327* (2020.01); *G06F 30/3308* (2020.01)

(58) Field of Classification Search
   CPC .......................... G06F 30/333; G06F 30/3308
   USPC ........................................................ 716/106
   See application file for complete search history.

(56) References Cited

U.S. PATENT DOCUMENTS

| | | | | |
|---|---|---|---|---|
| 5,991,523 A | * | 11/1999 | Williams | G06F 30/33 |
| | | | | 703/15 |
| 7,024,346 B1 | * | 4/2006 | Allard | G06F 30/367 |
| | | | | 714/741 |
| 8,775,987 B1 | | 7/2014 | Donlin et al. | |
| 10,210,294 B1 | | 2/2019 | Corbett | |
| 2017/0270228 A1 | * | 9/2017 | Sikka | G06F 30/331 |
| 2020/0279064 A1 | * | 9/2020 | Boutobza | G06F 30/337 |
| 2023/0111938 A1 | * | 4/2023 | Lafage | G01R 31/31908 |
| | | | | 714/738 |

OTHER PUBLICATIONS

Xilinx, Vivado Design Suite User Guide, Logic Simulation, https://www.xilinx.com/, UG900 (v2021.2) Oct. 22, 2021, Chapter 1, 5 pages.
Xilinx, Vivado Design Suite User Guide, Logic Simulation, https://www.xilinx.com/, UG900 (v2021.2) Oct. 22, 2021, Appendix G, Automated Testbench Generation for Sub-Design, 6 pages.

* cited by examiner

*Primary Examiner* — Jack Chiang
*Assistant Examiner* — Suchin Parihar
(74) *Attorney, Agent, or Firm* — Kevin T. Cuenot

(57) ABSTRACT

Testbench creation for sub-design verification can include receiving, using computer hardware, a selection of a sub-design of a circuit design. The sub-design is one of a plurality of sub-designs of the circuit design. The circuit design includes a plurality of parameter values. A list of port-level signal information is generated for the selected sub-design. The one or more parameter values of the circuit design are extracted. Switching activity of each port-level signal from the list is logged in a switching activity file while running a circuit design testbench for the circuit design with the selected sub-design in scope. From the list, the switching activity, and the one or more parameter values, a sub-design testbench for the selected sub-design is generated.

17 Claims, 7 Drawing Sheets

TESTBENCH FOR SUB-DESIGN VERIFICATION

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to integrated circuits (ICs) and, more particularly, to testbench creation for sub-design verification of a circuit design for an IC.

BACKGROUND

Modern integrated circuits (ICs) are developed through the use of hardware description languages (HDLs). HDLs such as VERILOG, VHDL, and the like allow developers to create software-based representations of circuit designs. One advantage of using an HDL is the potential for code reuse from one design to another. This concept has been realized with the commercial availability of intellectual property (IP) cores.

In general, an IP core refers to a software representation of a semiconductor component that provides a processing function. Different varieties of IP cores exist. For example, some IP cores can provide basic functions that can be included in a circuit design or, alternatively, can be used as subcomponents within a larger, more complex IP core. Another variety of IP core can function as a logic bridge to software-based bus objects, such as Peripheral Component Interconnect (PCI) or Advanced Microcontroller Bus Architecture (AMBA) busses.

Some IP cores are highly configurable and prior to release undergo extensive testing to verify whether the IP core is functionally correct. A common approach to verification of an IP core is with a testbench. A testbench, also referred to as a verification environment, provides test stimuli and verifies the behavior of a design under test, in this case one or more IP cores. Generating a testbench involves describing the connections, events, and test vectors for different combinations of transactions involving the one or more IP cores. A testbench also refers to the code used to create a pre-determined input sequence to the IP cores, as well as the code responsible for observing the response.

A typical circuit design includes a variety of different IP cores. These IP cores are often from different providers. As an example, a given circuit design may include one or more IP cores from more than one third-party provider and one or more originally developed IP cores. The IP cores interact with one another for correct operation of the circuit design. Any errors that occur between these different IP cores may manifest during simulation. Because the circuit design is simulated at a system level, e.g., where the entire circuit design is simulated, any errors that are observed may not provide an indication as to the particular IP core responsible.

SUMMARY

In one or more example implementations, a method can include receiving, using computer hardware, a selection of a sub-design of a circuit design. The sub-design is one of a plurality of sub-designs of the circuit design. The circuit design includes one or more parameter values. The method can include generating, using the computer hardware, a list of port-level signal information for the selected sub-design. The method can include extracting, using the computer hardware, the one or more parameter values of the circuit design. The method can include, using the computer hardware, logging switching activity of each port-level signal from the list in a switching activity file while running a circuit design testbench for the circuit design with the selected sub-design in scope. The method can include, using the computer hardware, generating, from the list, the switching activity, and the one or more parameter values, a sub-design testbench for the selected sub-design.

In one or more example implementations, a system includes a processor configured to initiate operations. The operations can include receiving a selection of a sub-design of a circuit design. The sub-design is one of a plurality of sub-designs of the circuit design. The circuit design includes one or more parameter values. The operations can include generating a list of port-level signal information for the selected sub-design. The operations can include extracting the one or more parameter values of the circuit design. The operations can include logging switching activity of each port-level signal from the list in a switching activity file while running a circuit design testbench for the circuit design with the selected sub-design in scope. The operations can include generating, from the list, the switching activity, and the one or more parameter values, a sub-design testbench for the selected sub-design.

In one or more example implementations, a computer program product includes one or more computer readable storage media, and program instructions collectively stored on the one or more computer readable storage media. The program instructions are executable by computer hardware to initiate operations. The operations can include receiving a selection of a sub-design of a circuit design. The sub-design is one of a plurality of sub-designs of the circuit design. The circuit design includes one or more parameter values. The operations can include generating a list of port-level signal information for the selected sub-design. The operations can include extracting the one or more parameter values of the circuit design. The operations can include logging switching activity of each port-level signal from the list in a switching activity file while running a circuit design testbench for the circuit design with the selected sub-design in scope. The operations can include generating, from the list, the switching activity, and the one or more parameter values, a sub-design testbench for the selected sub-design.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
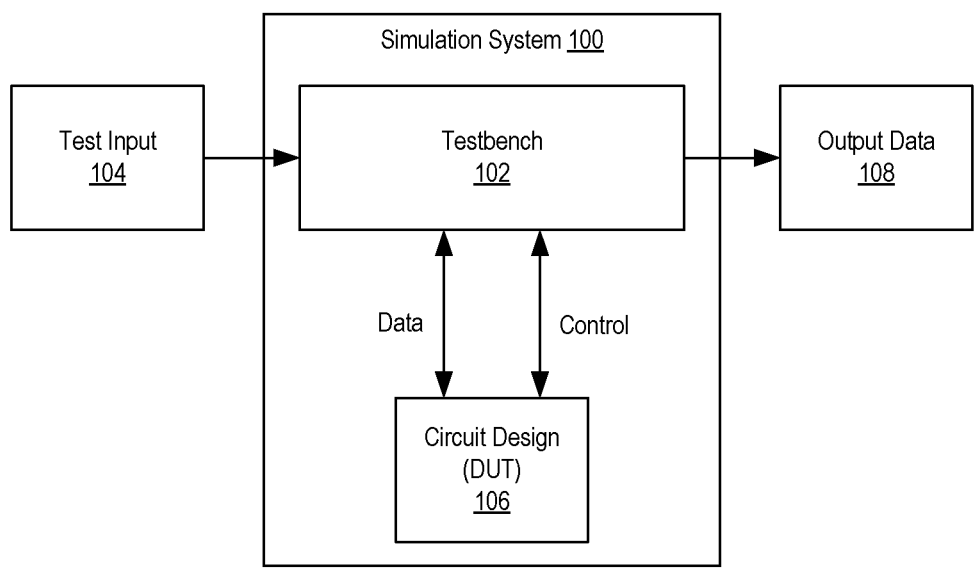
FIG. 1 is a block diagram illustrating an example of a simulation system including a testbench arrangement for testing circuit designs for integrated circuit devices.

This disclosure relates to integrated circuits (ICs) and, more particularly, to testbench creation for sub-design verification of a circuit design for an IC. In accordance with the inventive arrangements described within this disclosure, methods, systems, and computer program products are provided that are capable of automatically creating a testbench for one or more selected sub-designs of a larger circuit design. The circuit design may be hierarchical and include a plurality of sub-designs. For purposes of illustration, a sub-design may be implemented as an IP core or a module of hardware description language (HDL) or other program code. The resulting testbench for the sub-design is independent of the larger circuit design as the testbench is designated as a top module of the resulting simulation file set including the testbench. Thus, the resulting simulation file set that includes the generated testbench for the selected sub-design may be isolated or "sandboxed" from other portions of the larger circuit design and executed independently to verify functionality of the selected sub-design.

Creation of a testbench for a sub-design allows a user to simulate operation of that sub-design without having incur the overhead of simulating the entire circuit design from which the sub-design was extracted. The behavior of the sub-design may be verified in isolation in a modular fashion without interference from, or dependence on, other portions of the circuit design. As such, any errors that may exist in other portions of the circuit design do not influence or affect operation of the sub-design as simulated using the generated testbench. One outcome is that whether the selected sub-design is responsible for an error detected during simulation of the entire circuit design becomes clearly discernable. The independence of the resulting testbench means that the testbench is portable and may be simulated using any of a variety of different simulation platforms.

In one or more examples, as part of creating the testbench for the sub-design, any parameter values in effect for the sub-design as used in the context of the circuit design may be preserved and applied and/or used within the generated testbench. This ensures that the testbench for the sub-design is parameterized in the same manner as in the larger circuit design.

The inventive arrangements may be used in the context where simulating a circuit design generates one or more errors. To determine the particular sub-design of the circuit design responsible for generating the error or to confirm the source, a user may wish to generate a testbench for one or more sub-designs of the circuit design where each such testbench is a top module. This ensures that other portions of the circuit design, e.g., other sub-designs of the circuit design, do not influence simulation of the particular sub-design being simulated. That is, errors that may be generated in a first sub-design will not affect the simulation of the second or particular sub-system being simulated using its own dedicated testbench. Further aspects of the inventive arrangements are described below with reference to the figures.

FIG. 1 is a block diagram illustrating an example of a simulation system 100 including a testbench arrangement for testing IC devices. In the example, simulation system 100 may be implemented as executable program code that is capable executing on a data processing system such as the example data processing system 700 of FIG. 7. Simulation system 100 is capable of executing a testbench 102. Testbench 102 may be implemented as program code that is capable of executing on a data processing system such as data processing system 700 of FIG. 7 to drive data, e.g., input vectors, into circuit design 106 (e.g., the device under test or "DUT") and capture data generated by circuit design 106.

Testbench 102 is capable of receiving a test input 104 comprising test data and/or configuration data for circuit design 106. Testbench 102 is capable of driving the test input 104 to circuit design 106 and capturing data output from circuit design 106 as output data 108. In general, the testbench 102 couples data and control signals to, and receives return data and control signals from, the circuit design 106. The return data may comprise a test output from the circuit design 106 that may be provided to test equipment. Output data 108 will generally provide information for verifying circuit elements in the circuit design 106.

As will be described in more detail below, the example implementations described within this disclosure provide information related to an IC, such as one or more sub-designs of a larger circuit design implemented in the IC. Each sub-design may be specified as an IP core or a module, e.g., a level of hierarchy in the hierarchical circuit design. The IC in which the circuit design is implemented may be a programmable IC (e.g., Field Programmable Gate Array or other IC including programmable circuitry or programmable logic), a System-on-Chip, an Application-Specific IC (ASIC), a processor, or the like.

Figure 2:
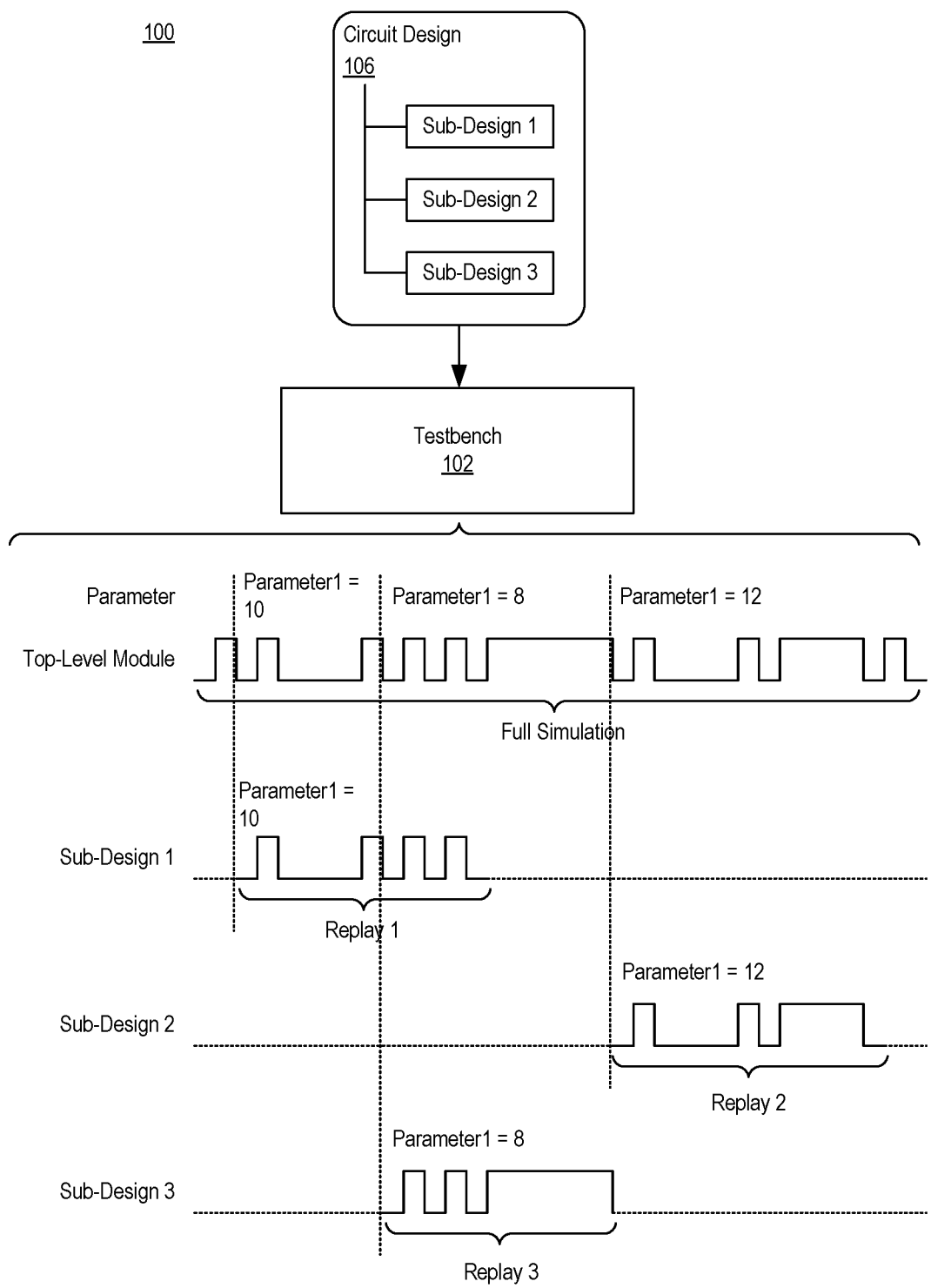
FIG. 2 illustrates an example of a testbench used to drive a circuit design.

FIG. 2 illustrates an example of testbench 102 used to drive circuit design 106. Circuit design 106 includes a plurality of sub-designs 1, 2, and 3. In one or more example implementations, circuit design 106 may be specified in an HDL, e.g., as a register transfer level (RTL) description. In one or more other examples, circuit design 106 may be specified in another language such as C/C++, System C, or the like. Further, different sub-designs may be specified in different languages.

As illustrated, throughout the full simulation of circuit design 106, one or more parameters of the circuit design are applied and in effect for operation of the various sub-designs 1, 2, and 3 included therein. Values of these parameters, for example, may be pushed down to the respective sub-designs during simulation from the top module. For purposes of illustration, the parameter "parameter1" initially has a value of 10, subsequently takes on a value of 8, and still later takes on a value of 12. If one were to replay operation of a particular sub-design of circuit design 106 from the full simulation, the sub-design would need to be provided with the correct parameter value given the point in time that the replay of that sub-design is to be performed.

For example, during the replay time window labeled replay 1 corresponding to sub-design 1, parameter1 is assigned a value of 10. Thus, correct simulation of sub-design 1 for the time window replay 1 would require that the value of parameter1 be set to 10. Similarly, during the replay time window replay 2 corresponding to sub-design 2, parameter1 is assigned on a value of 12. Thus, correct simulation of sub-design 2 for the time window replay 2 would require that the value of parameter1 be set to 12. Similarly, during the replay time window replay 3 corresponding to sub-design 3, parameter1 is assigned a value of 8. Thus, correct simulation of sub-design 3 for the time window replay 3 would require that the value of parameter1 be set to 8.

FIG. 2 is intended to illustrate an example of how each sub-design of a circuit design operates during a simulation in the context of the overall system, e.g., circuit design 106. Correct operation of the respective sub-designs requires the passing of parameter values from the top module to the respective sub-designs. It should be appreciated that a circuit design may include a large number of parameter values that may be specified that influence operation of the various sub-designs included therein. These parameter values may remain static during operation or dynamically change during operation and/or vary from one sub-design to another.

Referring again to FIG. 2, and for purposes of illustration, parameter1 may specify a frequency for one or more IP cores included in circuit design 106. As another example, an IP core such as an adder may require a parameter value specifying whether the IP core is to be implemented as an 8-bit adder or a 16-bit adder (e.g., the width of the IP core). Thus, parameters may specify any of a variety of different operating parameters of a sub-design ranging from data widths to operating frequencies, or the like.

Figure 3:
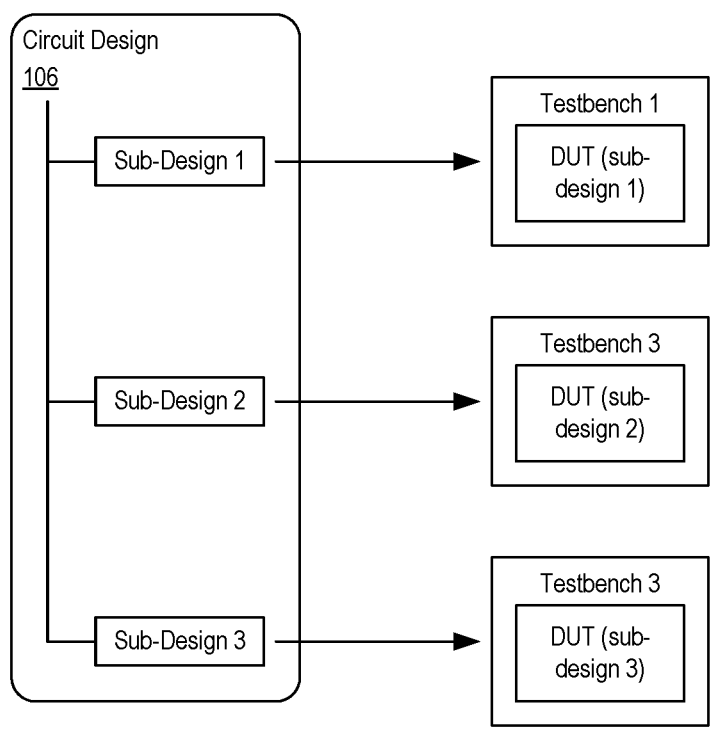
FIG. 3 illustrates an example in which the testbench of FIG. 2 has generated independent test benches corresponding to different sub-designs of a circuit design.

FIG. 3 illustrates an example in which testbench 102 of FIG. 2 has generated independent test benches 1, 2, and 3 corresponding to sub-designs 1, 2, and 3 of circuit design 106. In the example, testbench 1 is specifically implemented for sub-design 1 as the DUT. Testbench 2 is specifically implemented for sub-design 2 as the DUT. Testbench 3 is specifically implemented for sub-design 3 as the DUT.

Each testbench may be implemented so that the particular sub-design included therein is the top module of the simulation file set. That is, each simulation file set is independent of each other simulation file set and independent of the simulation file set for circuit design 106. Thus, each of the testbenches illustrated in FIG. 3 may be moved or ported to another simulation system (e.g., is simulation system independent), whether or not executed by a different data processing system. Each of the testbenches of FIG. 3 may be independent of the others and independent of the testbench for circuit design 106. This allows each sub-design to be tested and/or verified in isolation without interference from other portions of circuit design 106. As such, errors in each respective sub-design detected during simulation may be clearly identified and attributed to a particular source (e.g., a particular sub-design of the larger circuit design 106).

Figure 4:
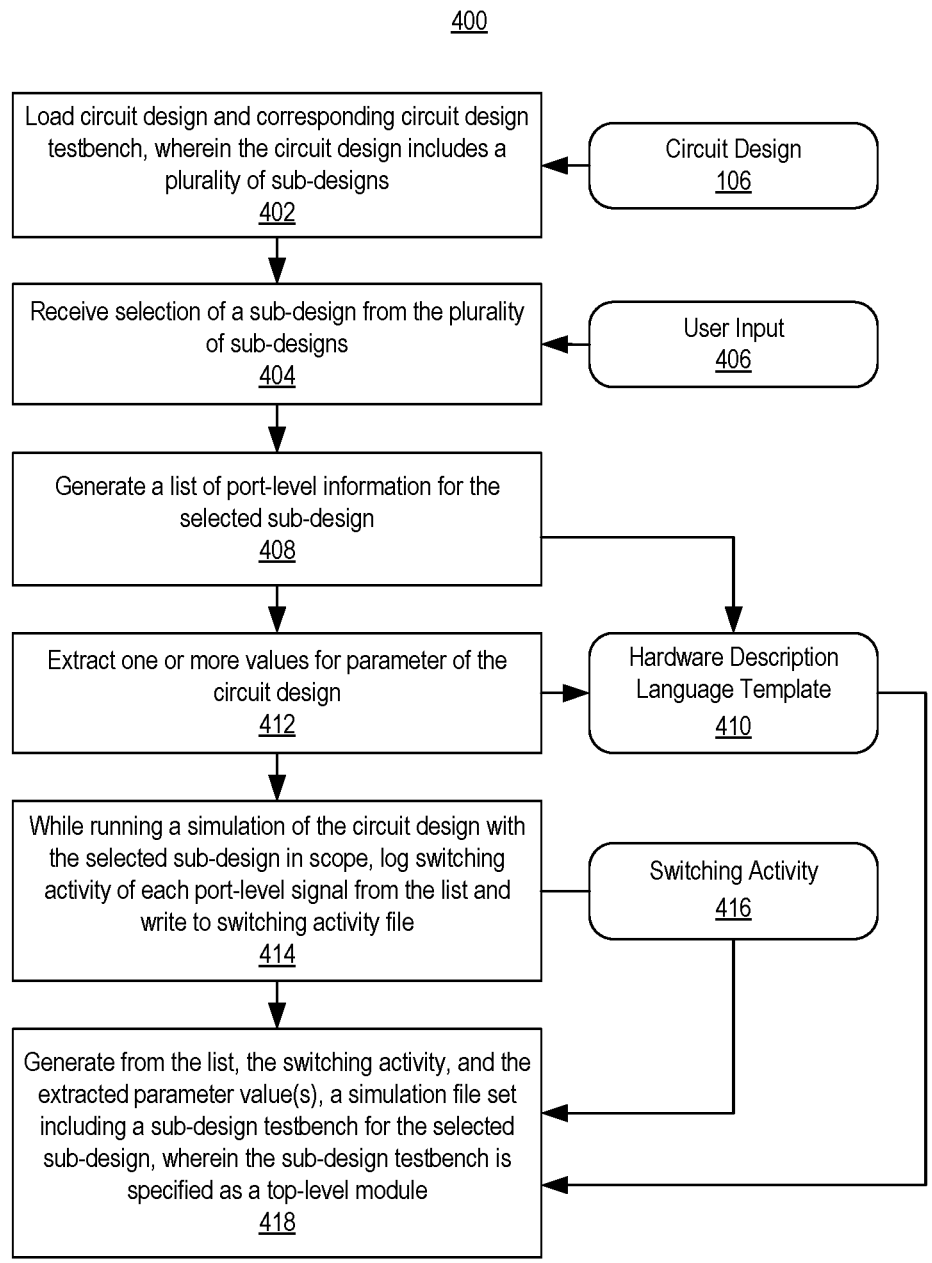
FIG. 4 illustrates an example method of operation for generating a testbench for a sub-design of a circuit design.

FIG. 4 illustrates an example method 400 of creating a testbench for a sub-design of a circuit design. Method 400 illustrates an example method of operation for a simulation system such as simulation system 100 to generate a testbench for a sub-design of a circuit design, where the circuit design includes a plurality of sub-designs. The simulation system is capable of generating a testbench for a selected sub-design where the resulting testbench, when executed for a given window of time and independently of the larger circuit design from which the selected sub-design was extracted, will generate output data that matches the output data generated by the sub-design when simulated as part of the larger circuit design. For example, referring to FIGS. 2 and 3, the resulting testbench 1 for sub-design 1 will generate output data (e.g., the waveform corresponding to time window replay 1) that matches the output of sub-design 1 generated during simulation of circuit design 106 for the same window of time.

For example, consider the case where a user has simulated the circuit design and suspects one or more sub-designs of the circuit design as the source of errors being observed in the full simulation. The operations described in connection with FIG. 4 may be performed to generate a testbench for one or more of the suspected sub-designs to verify each of the sub-designs independently. This allows a user to verify a variety of different aspects of operation of the selected sub-system. In one aspect, the user may verify that the input being provided to the selected sub-system is accurate. In addition, the user may verify that the selected sub-system is generating correct output given the observed input provided to the selected sub-system.

Method 400 may begin in a state where the simulation system is executing on a data processing system. Accordingly, in block 402, the simulation system is capable of loading the circuit design 106 and a corresponding circuit design testbench (e.g., a testbench for the circuit design). Circuit design 106 includes one or more parameters and includes a plurality of sub-designs. The user may simulate the circuit design and observe one or more errors in the simulation of the circuit design. In this example, the user decides to investigate operation of a particular sub-system more closely through generation of a sub-design testbench.

Accordingly, in block 404, the simulation system is capable of receiving a user input 406 that selects a particular sub-design from the plurality of sub-designs of circuit design 106. For purposes of illustration and ease of description, the sub-design selected by the user input 406 may be referred to herein as the "selected sub-design." In one or more examples, the user input may select a particular instance from a plurality of instances of the selected sub-design.

In block 408, the simulation system is capable of generating a list of one or more port-level signal (e.g., port-level signal information) for the selected sub-design. For example, the simulation system is capable of creating an HDL template 410 and writing the list of port-level signal information to the HDL template 410. The simulation system may also write to the list any instance information specifying the particular instance of the selected sub-design selected by the user.

For example, the simulation system is capable of parsing the circuit design 106 to identify the various sub-designs and sub-design instances contained in the circuit design. The parsing and/or detection of sub-designs and sub-design instances may be performed in response to the loading operation of block 402, in response to a simulation of circuit design 106, or in response to a user request to do so. The simulation system is capable of presenting a user interface (e.g., graphical or otherwise) that lists the sub-designs detected in circuit design 106. The list may be hierarchically ordered. The user may select a sub-design and/or instance thereof from those listed. In response, the simulation system is capable of presenting a list of the port-level signal of the selected sub-design/instance. A port-level signal refers to a signal of a port of the sub-design, where a port forms or is part of the input/output interfaces of the sub-design.

In one example, the simulation system may automatically select each port-level signal of the selected sub-design and write each such object to the list of port-level signal information. In another example, the simulation system may select only those port(s) and/or signal(s) specifically selected by the user and write each such object to the list of port-level signal information.

In another aspect, as part of block 408 the simulation system may create a switching activity file into which switching activity for the port-level signals from the list and for the selected sub-design may be written. For example, the simulation system may open a file handle to a switching activity file created by the simulation system.

As an example, the user input 406 may be a command such as "% generate_vcd_ports {<sub-design-hierarchical-instance>}" entered into a command line of the simulation system to initiate the operations described in connection with block 408. In another example, the user input 406 may be a graphical selection of the selected sub-design using a pointer and/or selection of one or more menu items initiating the operations described in connection with block 408.

In block 412, the simulation system is capable of extracting one or more values for parameters of the circuit design. In one aspect, the simulation system is capable of writing the extracted parameter values to the HDL template 410. It should be appreciated that the extracted parameter values may be stored in a different data structure than described and that storage of such data within HDL template 410 is not intended as a limitation of the inventive arrangements described within this disclosure.

For example, the simulation system is capable of parsing the selected sub-design and determining each of the parameters used by the selected sub-design. The system is capable of determining the value of the parameters used by the selected sub-design during operation (e.g., or simulation). For example, the default value of a given parameter used by the selected sub-design may be set to 20 within the circuit design. Within the circuit design, prior to instantiating the selected sub-design, the value for that parameter, as used by the selected sub-design, may be changed 3. Thus, the default value of the parameter that is set within the circuit design is overridden prior to instantiating the selected sub-design. In block 412, the simulation system detects this change or overriding of the parameter value and extracts the changed value of "3" that will be used to instantiate and parameterize the selected sub-design rather than the default value of 20 that may be used by other sub-designs but not the selected sub-design. The value of 3, as extracted, is written to the HDL template 410 or other data structure.

In block 414, the simulation system is capable of running a simulation of the circuit design with the selected sub-design (e.g., or instance thereof) in scope. With the selected sub-design "in scope," the simulation system captures the signal values of the port-level signals from the list for the selected sub-design. The signals for which switching activity is captured includes only those signals for ports of the selected sub-design. That is, the port-level signals are the input and output signals of the selected sub-design that exclude the internal signals of the selected sub-design. The simulation system need not capture or store values for other signals, e.g., those signals and/or ports not specified on the list.

Further, the simulation of the circuit design need not be for the entire duration that may have been previously simulated. Rather, the simulation of the circuit design in block 414 may be for a period of time specified by the user that may be a subset of the period of time used for the entire circuit design. In one or more aspects, the user may specify the period of time for the simulation in block 404, for example, or at another time prior to execution of block 414. Thus, simulation system is capable of logging the switching activity of each port-level signal specified by the list and writing such data (e.g., switching activity 416) to the switching activity file.

In one or more example implementations, the switching activity file may be implemented as a Value Change Dump (VCD) file. A VCD file is in an ASCII-based format and includes a series of time-ordered value changes for the signals in a given simulation model. The VCD includes a sequence of timestamps. With each timestamp the signals whose values change are listed (e.g., value/id pair). It should be appreciated that a VCD file is one example of a file that may be used to store switching activity. Other types of files and/or formats may be used such as a Waveform Data Base (WDB) file, a Fast Signal Data Base (FSDB) file, or the like. The particular file type and/or data structure used to store the switching activity is not intended as a limitation of the inventive arrangements described within this disclosure.

In block 418, the simulation system is capable of generating, from the list (e.g., HDL template 410), the one or more parameter values (e.g., the HDL template 410 or other data structure) as extracted, and the switching activity 416, a simulation file set including a testbench for the sub-design (also referred to as a "sub-design testbench"). The sub-design testbench is specified as a top module.

Figure 5:
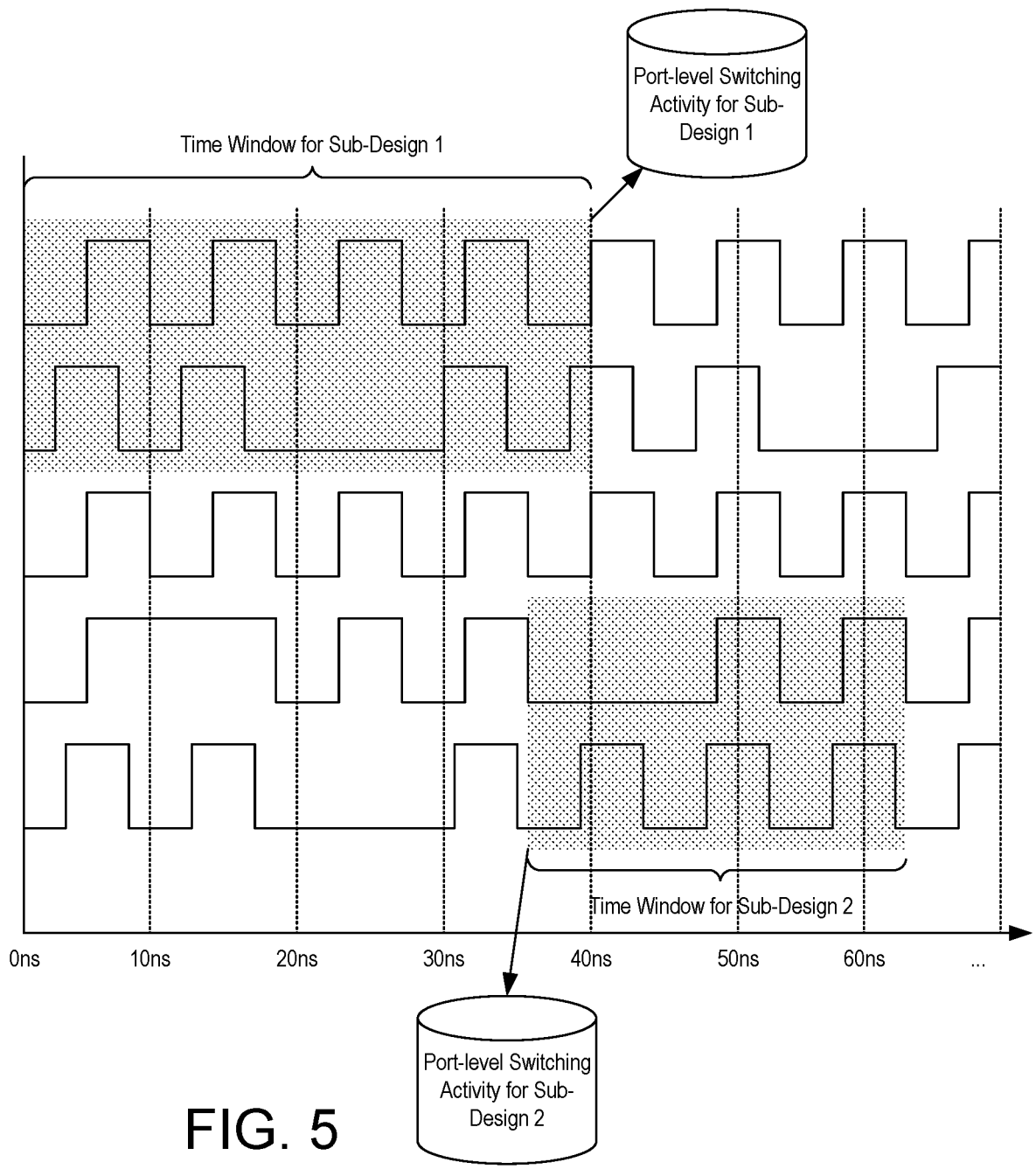
FIG. 5 illustrates certain operative features of the example simulation system described within this disclosure.

FIG. 5 illustrates certain operative features of the example simulation system described within this disclosure. More particularly, FIG. 5 illustrates certain operative features of block 414 of FIG. 4. In the example of FIG. 5, two different sub-designs have been selected by the user to create a sub-design testbench for each. The entire duration of the simulation for the circuit design is illustrated in FIG. 5. The shaded portions illustrate the user specified time window for sub-design 1 (e.g., the first selected sub-design) and the user specified time window for sub-design 2 (e.g., the second selected sub-design). The example of FIG. 5 illustrates that that the simulation system, during simulation of the circuit design with sub-design 1 and sub-design 2 in scope, captures the switching activity (e.g., signal/time value pairs) for each selected sub-design within respective ones of switching activity files illustrated.

Switching activity for signals of other sub-designs and internal signals of the sub-designs that are not port-level signals (e.g., interface or I/O signals of the selected sub-designs) are not captured during block 414 into the switching activity file.

Capturing switching activity 416 (e.g., port-level switching activity for sub-design 1 and for sub-design 2) only for the selected sub-system (or sub-systems as the case may be), facilitates faster and more runtime efficient operation of the simulation system. In general, computer-based simulation is significantly slower than the operation of the physical implementation of the circuit design being simulated. Adding signal capture for every signal of the circuit design 106 (e.g., where this may include potentially millions of signals), would be unduly slow and also generate an unwieldy amount of data.

Another benefit of capturing only the switching activity of the selected sub-design as the port level, as opposed to also collecting the switching activity of internal nodes of the selected sub-design, avoids revealing the internal workings or details of the selected sub-design. This preserves the confidentiality of the sub-design itself in cases where the resulting sub-design testbench may be provided to third parties for analysis. That is, the user is able to provide the resulting sub-design testbench to a third party without revealing details about (1) the larger circuit design and/or (2) internal workings of the sub-design.

Figure 6:
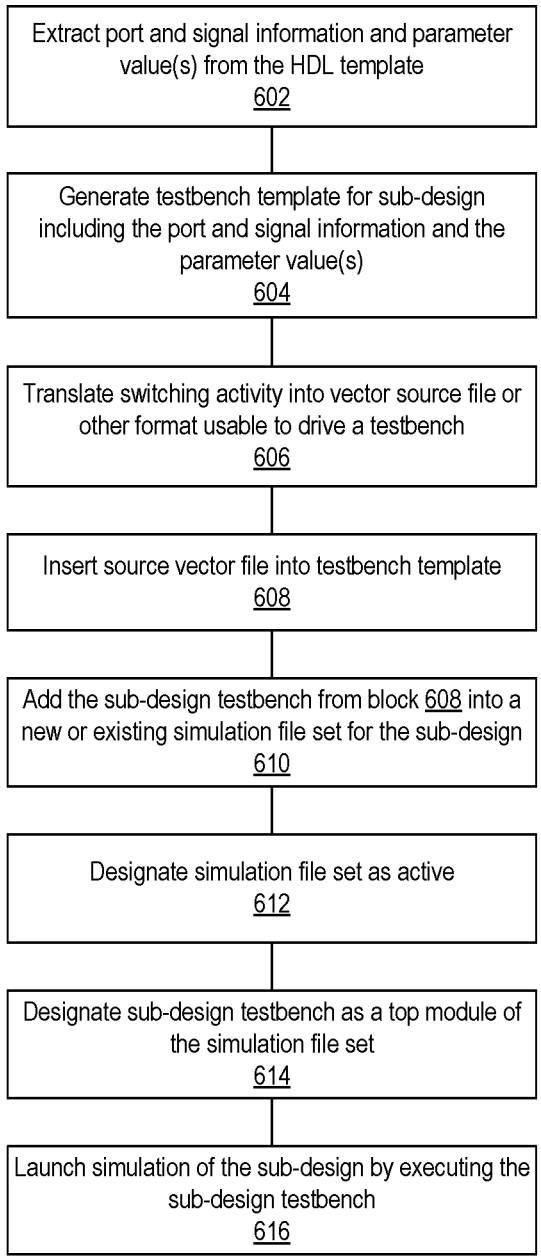
FIG. 6 illustrates another example method of operation for generating a testbench for a sub-design of a circuit design.

FIG. 6 illustrates an example method 600 of operation for generating a testbench for a sub-design of a circuit design. Method 600 illustrates certain operations performed by the simulation system in implementing block 418 of FIG. 4.

In block 602, in response to a user input requesting generation of a sub-design testbench for the selected testbench, the simulation system is capable of extracting the port-level signal information and the one or more parameter values from HDL template 410.

In block 604, the simulation system is capable of writing the extracted data to a testbench template. The testbench template may be specified or written in a particular HDL. As an example, the testbench template may be specified in System Verilog and is a functional testbench when completed. For example, the simulation system is capable of writing to the testbench template data such as a port specification block and parameter declarations (initialized to any updated value(s) propagated from the top-level simulation run). Referring to the prior example, the parameter declaration for the sub-design testbench template will set the parameter value to 3 (e.g., as opposed to 20). Further, the simulation system is capable of writing to the testbench template the sub-design unit instantiation as the DUT.

In block 606, the simulation system is capable of translating the switching activity 416 from the switching activity file into a vector source file or other format that may be used to drive a testbench. The vector source file, for example, defines the event-based stimuli to be exercised by the sub-design testbench. In one or more example implementations, the switching activity may be translated into a vector source file using one or more known translation techniques. An example of a technique that may be used by the simulation system to generate the vector source file is disclosed in U.S. Pat. No. 8,775,987 titled "Generation of a Replay Module for Simulation of a Circuit Design" to Xilinx, Inc. of San Jose, California, which is incorporated herein by reference. Another example of a technique that may be used by the simulation system to generate the vector source file is disclosed in U.S. Pat. No. 10,210,294 titled "System and Methods for Simulating a Circuit Design" to Xilinx, Inc. of San Jose, California, which is incorporated herein by reference. In block 508, the simulation system inserts the generated vector source file within the testbench template thereby resulting in, or creating, the sub-design testbench.

In block 610, the simulation system is capable of adding the sub-design testbench to an existing or a new simulation file set for the sub-design. For example, the sub-design testbench may be written to a directory specifically for simulation of the sub-design. The directory may include, as part of the simulation file set, any files needed to simulate the sub-design including the source files for the sub-design itself and the source vector file generated in block 606. Inclusion of the simulation file set for the sub-design testbench effectively sandboxes simulation of the sub-design from other portions of the circuit design.

In block 612, the simulation system designates the simulation file set to which the sub-design testbench is written as active if not already so designated. Once designated as active, the simulation system may display the simulation file set via user interfaces as a testbench that is available for use (e.g., execution) by the user. The sub-design testbench may be displayed for selection by a user along with the circuit design testbench and/or any other sub-design testbenches for the circuit design that may have been generated.

In general, a circuit design may have multiple simulation file sets with each such simulation file set containing a testbench and underlying DUT. Only one simulation file set may be designated as the active file set at any given time. Designating a file set as active means that the user is able to launch simulation for this file set directly via the tool. Accordingly, designating the simulation file including the sub-design testbench as the active file set means that the user is able to directly launch simulation of the newly generated simulation file set for the sub-design, e.g., the sub-design testbench.

In block 614, the simulation system is capable of designating the sub-design testbench as a top module in the simulation file set. With the sub-design testbench designated as a top module, users of the simulation system may directly launch a simulation of the sub-design using the generated simulation file set independently of any other testbench. As noted, the resulting simulation file set, including the sub-design testbench, is portable and may be simulated using other available simulation environments.

In block 616, the simulation system, in response to a user request to do so, is capable of launching a simulation of the sub-design. The simulation system is capable of executing the sub-design testbench. The behavior of the sub-design may be verified from the simulation.

Listing 1 illustrates an example of a sub-design testbench generated in accordance with the inventive arrangements described within this disclosure. In the example of Listing 1, the sub-design is a first-in-first-out buffer defined by the module called "tb_fifo". The sub-design testbench includes a port specification block, the parameter declarations (e.g., the "initial" block), and the sub-design unit instantiation. The vector file to be used as the input data driving the DUT (e.g., the sub-design) is specified using the "include" statement and is called "FifoBuffer.xil_tb_vectors.sv".

Listing 1

```
`timescale 1ps/1ps
module_tb_fifo ( );
    reg [31:0] din;
    reg rd_clk;
    reg rd_en;
    reg rst;
    reg wr_clk;
    reg wr_en;
    wire [31:0] dout;
    wire empty;
    wire full;
    defparam DUT.Parameter1 = 8;
    `tinclude "FifoBuffer.xil_tb_vectors.sv"
    initial begin
      $timeformat(-3,0,"ms",10);
      `tifdef VCS
        $dumpfile("comp_FifoBuffer.vcd");
        $dumpvars(1, tb_fifo.DUT);
        //$dumpports(tb_fifo.DUT, "comp_FifoBuffer.vcd");
        //$dumpfile("full_comp_FifoBuffer.vcd");
        //$dumpvars(0, tb_fifo.DUT);
      `telse
      `tifdef INCA
        $dumpports(tb_fifo.DUT, "comp_FifoBuffer.vcd");
        //$dumpfile("full_comp_FifoBuffer.vcd");
        //$dumpvars(0, tb_fifo.DUT);
      `telse
      `tifdef MODEL_TECH
        $dumpports(tb_fifo.DUT, "comp_FifoBuffer.vcd");
        //$dumpfile("full_comp_FifoBuffer.vcd");
        //$dumpvars(0, tb_fifo.DUT);
```

-continued

Listing 1

```
    `telse
        $dumpfile("comp_FifoBuffer.vcd");
        $dumpvars(1, tb_fifo.DUT);
        //$dumpfile("full_comp_FifoBuffer.vcd");
        //$dumpvars(0, tb_fifo.DUT);
    `tendif
    `tendif
    `tendif
end
FifoBuffer DUT (
    .din (din),
    .rd_clk (rd_clk),
    .rd_en (rd_en),
    .rst (rst),
    wr_clk (wr_clk),
    .wr_en (wr_en),
    .dout (dout),
    .empty (empty),
    .full (full)
);
endmodule
```

The inventive arrangements described herein are capable of preserving the state of any selected sub-design and/or simulation settings from an existing simulation flow (e.g., circuit design level testbench). The resulting sub-design testbench may be executed or launched in a respective sandbox directory thereby allowing a user to verify the sub-design in a team-based environment.

Though independent of the circuit design level testbench, the sub-design testbench(es) may be displayed by the simulation system in a hierarchy of testbenches available for the circuit design. This allows users to launch the simulation of the circuit design or a simulation of any selected sub-design. Users may also launch multiple sub-design testbenches to verify each sub-design independently from the circuit design level file set (e.g., testbench). In another aspect, users may also modify the source vector file and/or any parameter values for further simulation and testing of the sub-design (s).

Figure 7:
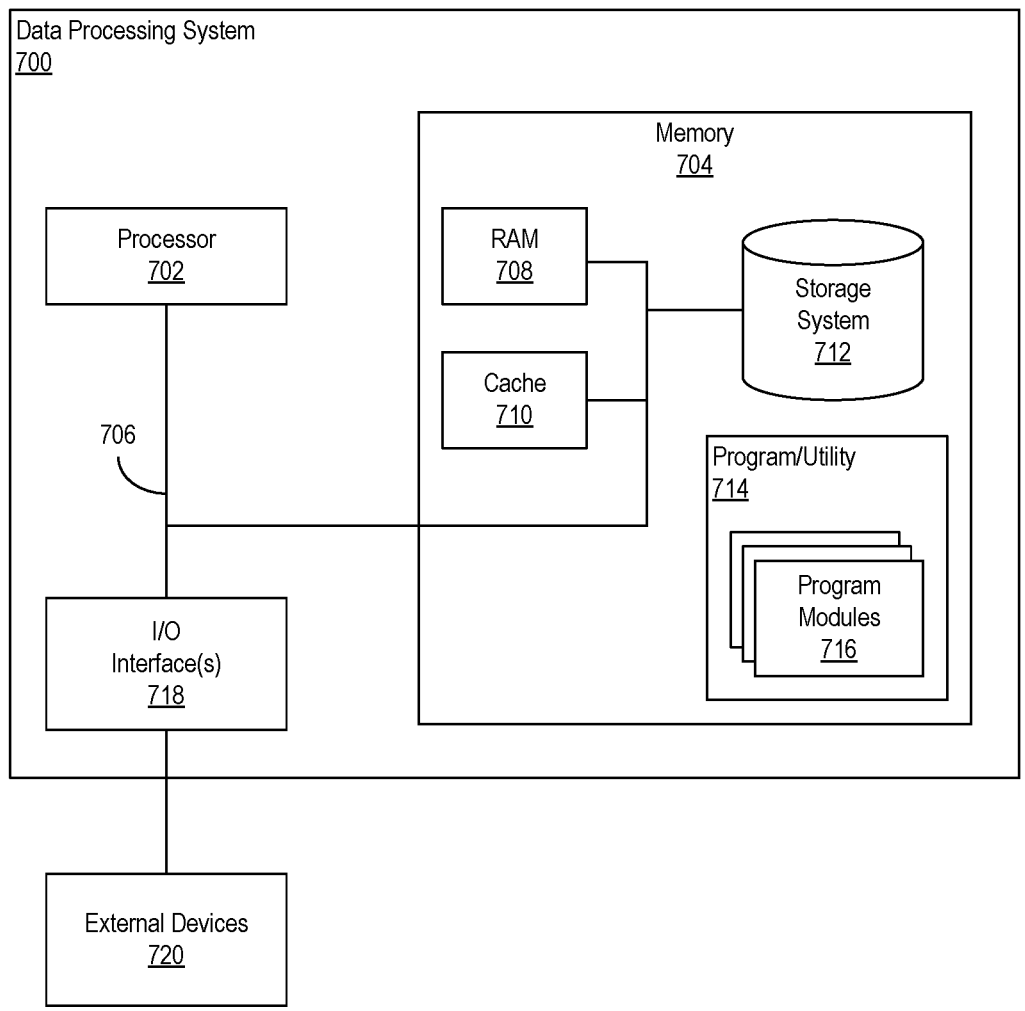
FIG. 7 illustrates an example implementation of a data processing system for use with the inventive arrangements described herein.

FIG. 7 illustrates an example implementation of a data processing system 700. As defined herein, "data processing system" means one or more hardware systems configured to process data, each hardware system including at least one processor programmed to initiate operations and memory.

The components of data processing system 700 can include, but are not limited to, a processor 702, a memory 704, and a bus 706 that couples various system components including memory 704 to processor 702. Processor 702 may be implemented as one or more processors. In an example, processor 702 is implemented as a central processing unit (CPU). As defined herein, the term "processor" means at least one circuit capable of carrying out instructions contained in program code. The circuit may be an integrated circuit or embedded in an integrated circuit. Processor 702 may be implemented using a complex instruction set computer architecture (CISC), a reduced instruction set computer architecture (RISC), a vector processing architecture, or other known architectures. Example processors include, but are not limited to, processors having an x86 type of architecture (IA-32, IA-64, etc.), Power Architecture, ARM processors, and the like.

Bus 706 represents one or more of any of a variety of communication bus structures. By way of example, and not limitation, bus 706 may be implemented as a Peripheral Component Interconnect Express (PCIe) bus. Data processing system 700 typically includes a variety of computer system readable media. Such media may include computer-readable volatile and non-volatile media and computer-readable removable and non-removable media.

Memory 704 can include computer-readable media in the form of volatile memory, such as random-access memory (RAM) 708 and/or cache memory 710. Data processing system 700 also can include other removable/non-removable, volatile/non-volatile computer storage media. By way of example, storage system 712 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 706 by one or more data media interfaces. Memory 704 is an example of at least one computer program product.

Program/utility 714, having a set (at least one) of program modules 716, may be stored in memory 704. Program/utility 714 is executable by processor 702. By way of example, program modules 716 may represent an operating system, one or more application programs, other program modules, and program data. Program modules 716, upon execution, cause data processing system 700, e.g., processor 702, to carry out the functions and/or methodologies of the example implementations described within this disclosure. Program/utility 714 and any data items used, generated, and/or operated upon by data processing system 700 are functional data structures that impart functionality when employed by data processing system 700. As defined within this disclosure, the term "data structure" means a physical implementation of a data model's organization of data within a physical memory. As such, a data structure is formed of specific electrical or magnetic structural elements in a memory. A data structure imposes physical organization on the data stored in the memory as used by an application program executed using a processor.

For example, one or more program modules 716, upon execution, may implement the simulation system as described within this disclosure and/or perform the operations described herein. One or more of modules 716, when executed, also may implement an electronic design automation (EDA) system capable of performing a design flow (e.g., synthesis, placement, and/or routing) on a circuit design or portion thereof so that a circuit design may be physically realized in an IC.

Data processing system 700 may include one or more Input/Output (I/O) interfaces 718 communicatively linked to bus 706. I/O interface(s) 718 allow data processing system 700 to communicate with one or more external devices 720 and/or communicate over one or more networks such as a local area network (LAN), a wide area network (WAN), and/or a public network (e.g., the Internet). Examples of I/O interfaces 718 may include, but are not limited to, network cards, modems, network adapters, hardware controllers, etc. Examples of external devices also may include devices that allow a user to interact with data processing system 700 (e.g., a display, a keyboard, and/or a pointing device) and/or other devices such as accelerator card.

Data processing system 700 is only one example implementation. Data processing system 700 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices.

As used herein, the term "cloud computing" refers to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service.

It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "soft" in reference to a circuit means that the circuit is implemented in programmable logic or programmable circuitry. Thus, a "soft processor" means at least one circuit implemented in programmable circuitry that is capable of carrying out instructions contained in program code.

As defined herein, the term "output" means storing in physical memory elements, e.g., devices, writing to display or other peripheral output device, sending or transmitting to another system, exporting, or the like.

As defined herein, the term "real time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

In one or more example implementations, a method can include receiving, using computer hardware, a selection of a sub-design of a circuit design. The sub-design is one of a plurality of sub-designs of the circuit design. The circuit design includes one or more parameter values. The method can include generating, using the computer hardware, a list of port-level signal information for the selected sub-design. The method can include extracting, using the computer hardware, the one or more parameter values of the circuit design. The method can include, using the computer hardware, logging switching activity of each port-level signal from the list in a switching activity file while running a circuit design testbench for the circuit design with the selected sub-design in scope. The method can include, using the computer hardware, generating, from the list, the switching activity, and the one or more parameter values, a sub-design testbench for the selected sub-design.

The foregoing and other implementations can each optionally include one or more of the following features, alone or in combination. Some example implementations include all the following features in combination.

In one aspect, the selected sub-design is for a particular instance of the selected sub-design selected from a plurality of instances of the selected sub-design.

In another aspect, the list of port-level signal information and the one or more parameter values as extracted are stored in an HDL template. The generating the sub-design testbench can include extracting the port-level signal information from the HDL template and generating an HDL testbench template using the extracted port-level signal information.

In another aspect, the method can include extracting port-level signal activity from the switching activity file and generating a vector source file based on the extracted port-level signal activity.

In another aspect, the method can include including the vector source file within the HDL testbench template resulting in the sub-design testbench.

In another aspect, the method can include adding the sub-design testbench to an independent simulation file set for the selected sub-design. The sub-design testbench is designated as a top module.

In another aspect, the method can include executing a simulation of the sub-design testbench.

In one or more example implementations, a system having a processor is capable of initiating and/or performing the various operations described within this disclosure.

In one or more example implementations, a computer program product includes one or more computer readable storage media, and program instructions collectively stored on the one or more computer readable storage media. The program instructions are executable by computer hardware to initiate the various operations described within this disclosure.

What is claimed is:

1. A method, comprising:
   receiving, using computer hardware, a selection of a selected sub-design of a circuit design, wherein the selected sub-design is one of a plurality of sub-designs of the circuit design;
   generating, using the computer hardware, a list of port-level signals for the selected sub-design;
   extracting, using the computer hardware, one or more parameter values corresponding to the selected sub-design from the circuit design;
   using the computer hardware, logging switching activity only for each port-level signal from the list in a switching activity file while running a circuit design testbench for the circuit design with the selected sub-design in scope; and
   using the computer hardware, generating, from the list, the switching activity file, and the one or more parameter values, a sub-design testbench for the selected sub-design by, at least in part:
      generating a hardware description language testbench template that includes the port-level signals and the one or more parameter values;
      generating a vector source file based on the switching activity of the port-level signals from the switching activity file; and
      including the vector source file within the hardware description language testbench template resulting in the sub-design testbench.

2. The method of claim 1, wherein the selected sub-design is for a particular instance of the selected sub-design selected from a plurality of instances of the selected sub-design.

3. The method of claim 1, wherein the list of port-level signals and the one or more parameter values as extracted are stored in a hardware description language template, wherein the generating the sub-design testbench comprises:
   extracting the port-level signals from the hardware description language template to generate the hardware description language testbench template.

4. The method of claim 3, wherein the switching activity of each port-level signal is extracted from the switching activity file to generate the vector source file.

5. The method of claim 1, further comprising:
   adding the sub-design testbench to an independent simulation file set for the selected sub-design, wherein the sub-design testbench is designated as a top module.

6. The method of claim 1, further comprising:
   executing a simulation of the sub-design testbench.

7. A system, comprising:
   a processor configured to initiate operations including:
      receiving a selection of a selected sub-design of a circuit design, wherein the selected sub-design is one of a plurality of sub-designs of the circuit design;
      generating a list of port-level signals for the selected sub-design;
      extracting one or more parameter values corresponding to the selected sub-design from the circuit design;
      logging switching activity only for each port-level signal from the list in a switching activity file while running a circuit design testbench for the circuit design with the selected sub-design in scope; and
      generating, from the list, the switching activity file, and the one or more parameter values, a sub-design testbench for the selected sub-design by, at least in part:
         generating a hardware description language testbench template that includes the port-level signals and the one or more parameter values;
         generating a vector source file based on the switching activity of the port-level signals from the switching activity file; and
         including the vector source file within the hardware description language testbench template resulting in the sub-design testbench.

8. The system of claim 7, wherein the selected sub-design is for a particular instance of the selected sub-design selected from a plurality of instances of the selected sub-design.

9. The system of claim 7, wherein the list of port-level signals and the one or more parameter values as extracted are stored in a hardware description language template, wherein the generating the sub-design testbench comprises:
   extracting the port-level signals from the hardware description language template to generate a hardware description language testbench template.

10. The system of claim 9, wherein the switching activity of each port-level signal is extracted from the switching activity file to generate the vector source file.

11. The system of claim 7, wherein the processor is configured to initiate operations further comprising:
   adding the sub-design testbench to an independent simulation file set for the selected sub-design, wherein the sub-design testbench is designated as a top module.

12. The system of claim 7, wherein the processor is configured to initiate operations further comprising:
   executing a simulation of the sub-design testbench.

13. A computer program product, comprising:
   one or more computer readable storage media, and program instructions collectively stored on the one or more computer readable storage media, wherein the program instructions are executable by computer hardware to initiate operations including:
      receiving a selection of a selected sub-design of a circuit design, wherein the selected sub-design is one of a plurality of sub-designs of the circuit design;

generating a list of port-level signals for the selected sub-design;

extracting one or more parameter values corresponding to the selected sub-design from the circuit design;

logging switching activity only for each port-level signal from the list in a switching activity file while running a circuit design testbench for the circuit design with the selected sub-design in scope; and generating, from the list, the switching activity file, and the one or more parameter values, a sub-design testbench for the selected sub-design by, at least in part:

generating a hardware description language testbench template that includes the port-level signals and the one or more parameter values;

generating a vector source file based on the switching activity of the port-level signals from the switching activity file; and including the vector source file within the hardware description language testbench template resulting in the sub-design testbench.

14. The computer program product of claim 13, wherein the selected sub-design is for a particular instance of the selected sub-design selected from a plurality of instances of the selected sub-design.

15. The computer program product of claim 13, wherein the list of port-level signals and the one or more parameter values as extracted are stored in a hardware description language template, wherein the generating the sub-design testbench comprises:

extracting the port-level signals from the hardware description language template to generate the hardware description language testbench template.

16. The computer program product of claim 15, wherein the switching activity of each port-level signal is extracted from the switching activity file to generate the vector source file.

17. The computer program product of claim 13, wherein the program instructions are executable by the computer hardware to initiate operations further comprising:

adding the sub-design testbench to an independent simulation file set for the selected sub-design, wherein the sub-design testbench is designated as a top module.

\* \* \* \* \*